United States Patent [19]

Getter et al.

[11] Patent Number: 5,170,336
[45] Date of Patent: Dec. 8, 1992

[54] DC TO AC INVERTER WITH IMPROVED FORCED AIR COOLING METHOD AND APPARATUS

[75] Inventors: Dennis L. Getter, Little Canada; Frederick D. Heavey, St. Paul, both of Minn.

[73] Assignee: Dimensions Unlimited, Inc., St. Paul, Minn.

[21] Appl. No.: 751,602

[22] Filed: Aug. 21, 1991

Related U.S. Application Data

[63] Continuation of Ser. No. 487,929, Mar. 5, 1990, abandoned.

[51] Int. Cl.$^5$ .................................................. H05K 1/20
[52] U.S. Cl. ........................................ 363/141; 361/384
[58] Field of Search ................ 363/141; 361/383, 384; 165/80.3, 104.33, 122; 336/60

[56] References Cited

U.S. PATENT DOCUMENTS

| | | | |
|---|---|---|---|
| 3,454,916 | 7/1969 | Hoover | 336/60 |
| 4,035,715 | 7/1977 | Wyman et al. | 323/268 |
| 4,237,521 | 12/1980 | Denker | 361/384 |
| 4,500,944 | 2/1985 | Roberts et al. | 361/384 |
| 4,691,274 | 9/1987 | Matouk et al. | 361/384 |
| 4,797,782 | 1/1989 | Wistling | 361/384 |
| 4,817,865 | 4/1989 | Wray | 361/384 X |
| 4,872,102 | 10/1989 | Getter | 363/141 |
| 4,890,050 | 12/1989 | MacKevich | 363/141 X |

*Primary Examiner*—Steven L. Stephan
*Assistant Examiner*—Kristine Peckman
*Attorney, Agent, or Firm*—Leone & Moffa

[57] ABSTRACT

An improved DC to AC electrical inverter has a new and improved method and apparatus with forced air ventilation cooling that significantly increases sustainable AC power output. The methods include the steps of forcing an air flow out of the inverter enclosure and over an external heat sink, and forcing an air flow through a special power transformer between the windings and the core. The apparatus has at least one fan, an air outlet and structure for guiding and directing a forced air flow to and over an external heat sink for the power switches. A structure to continuously force cooling air through the power transformer is also provided.

20 Claims, 3 Drawing Sheets

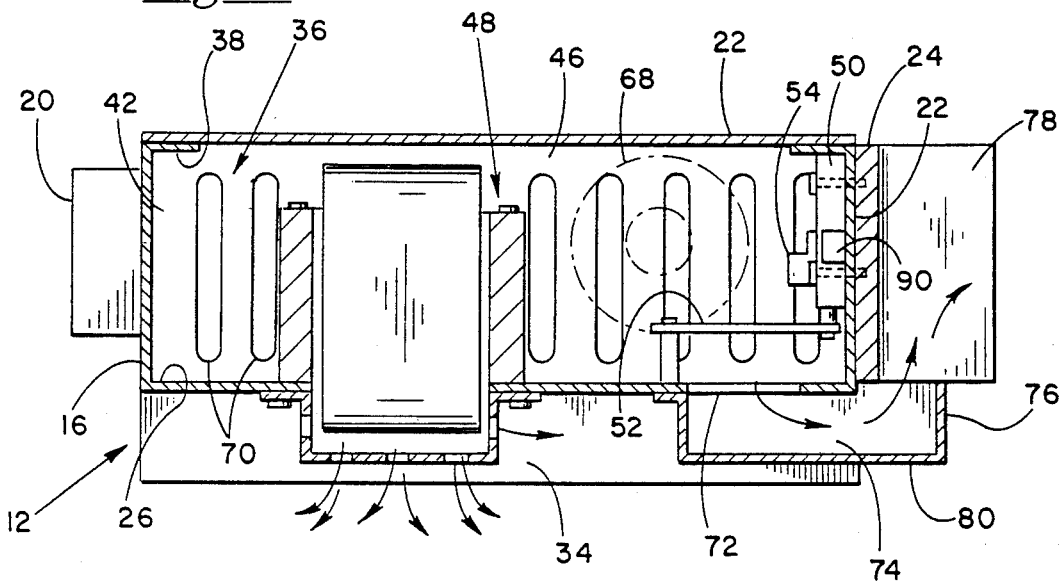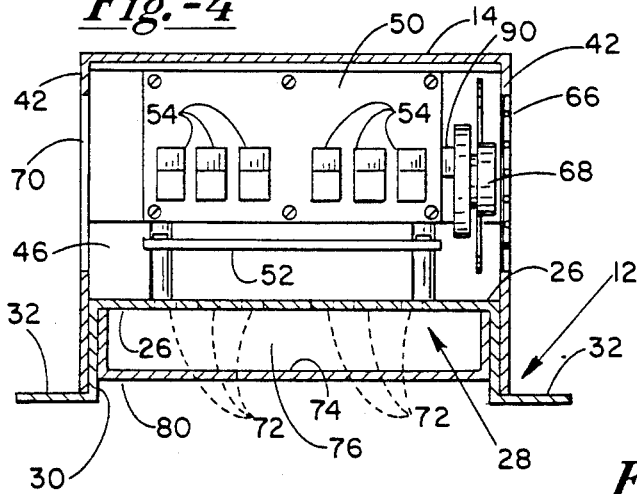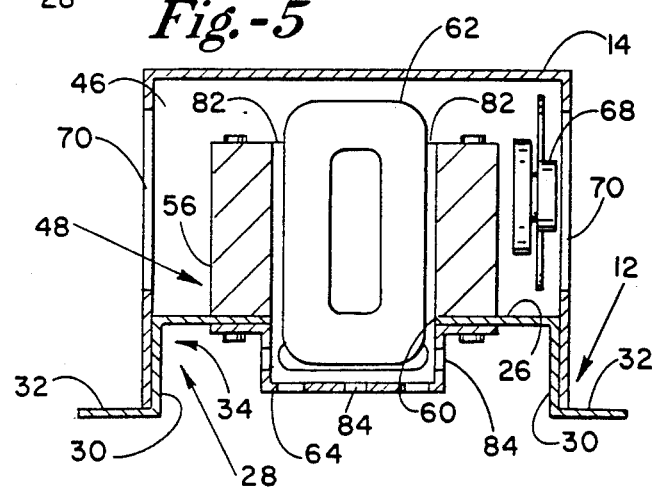

DC TO AC INVERTER WITH IMPROVED FORCED AIR COOLING METHOD AND APPARATUS

This is a continuation of copending application Ser. No. 487,929, filed on Mar. 5, 1990 now abandoned.

BACKGROUND OF THE INVENTION

This invention pertains to a method of and apparatus for inverting DC to AC with forced ventilation cooling steps and structure to increase current capabilities of a given physical size of inverter.

The Prior Art

The prior art is exemplified by commonly owned Dennis L. Getter U.S. Pat. No. 4,872,102 of Oct. 3, 1989.

The DC to AC inverter disclosed and claimed therein operates exactly as defined therein.

However it has been almost four years since the inverter of 4,872,102 was devised and now inverter users want yet more current capacity in the same physical size of inverter. The users want more current capacity for medical equipment, refrigeration, microwave ovens and so forth. In particular, the users want a higher sustained power output per unit of physical size.

OBJECTS OF THE INVENTION

It is an object of this invention to provide an improved DC to AC inverter having a new forced ventilation system.

It is an object of this invention to provide a new method and apparatus for forced ventilation cooling of a DC to AC inverter, enabling higher current capacity per unit of physical size.

It is an object of this invention to provide an improved DC to AC inverter utilizing improved methods and apparatus for forced ventilated cooling of the power switches.

It is an object of this invention to provide an improved DC to AC inverter utilizing improved methods and apparatus for forced ventilation cooling of the power transformer.

SUMMARY OF THE INVENTION

A DC to AC inverter has an enclosure, structure within the enclosure for inverting DC to AC, a finned heat sink for power switches, a fan for forcing air into the enclosure, at least one air outlet from the enclosure, and structure to direct outflowing air over the heat sink.

A DC to AC inverter has an enclosure, structure with the enclosure for inverting DC to AC, a power transformer in the inverting structure, structure sealing one end of the transformer to the enclosure, a transformer cooling passageway extending through the inside of the transformer and though the enclosure, and a fan for effecting an air flow into the enclosure and through the passageway to dynamically cool the power transformer.

A method of inverting DC to AC has the steps of drawing a flow of air into an inverter enclosure, turbulently moving the air inside of the enclosure, exhausting at least a portion of the moving air, and directing the exhausted air over an external heat sink for the electrical componentry.

A method of inverting DC to AC has the steps of effecting a flow of air into an inverter housing and exhausting at least part of the air through the metal core of a power transformer.

BRIEF DESCRIPTION OF THE DRAWINGS

FIG. 3 is a side elevational view in section through lines III—III;

FIG. 4 is an end elevational view in section through lines IV—IV;

FIG. 5 is an end elevational view in section through liens V—V; and

DESCRIPTION OF THE PREFERRED EMBODIMENT

Figure 1:
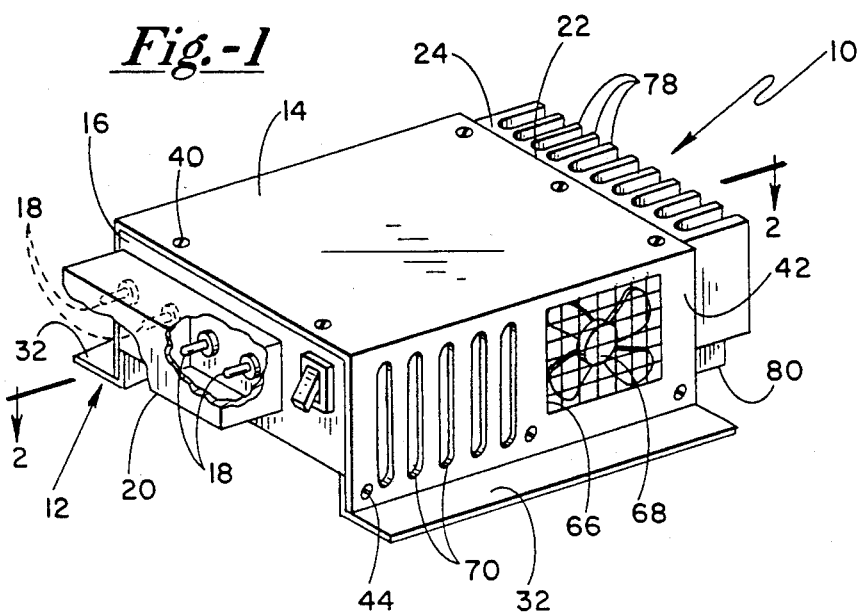
FIG. 1 is a perspective view looking at the outside of the preferred inverter of the present invention.

In accordance with the principles of this invention, an improved inverter is provided as shown in FIG. 1 and generally indicated by the numeral 10 for the production of alternating current (AC) from direct current (DC) of usually lower voltage. As a specific example, the inverter 10 will be connected to a 12 or 24 VDC battery power source and provide 115 VAC 60 Hz output or other AC voltage and frequency as desired.

The basic structure and electronic componentry is fully described in commonly owned Dennis L. Getter U.S. Pat. No. 4,872,102 of Oct. 3, 1989, the entire teachings of which are incorporated herein by reference thereto and the reader will please refer to this referenced patent for the basic structures and function of the inverter 10.

The inverter 10 has a frame 12, a cover 14, a wiring end 16 with low voltage DC input terminals 18 and a field wiring compartment 20, and a control end 22 having an external secondary heat sink 24.

The frame 12 as shown in FIGS. 1–5 is a combination structural frame and component support and primary heat sink for dissipation of heat from internal componentry. The frame 12 is made of quite high thermally conductive metal, a preferred material being 0.125 inch (3 mm) thick aluminum sheet. The frame 12 is a unitary contiguous member having first and second U-shaped cross-sections at generally right angles to each other and which share a common base 26. The first U-shape section, generally indicated by the numeral 28, is an inverted U-shape section 28 best shown in FIGS. 4 and 5. This U-section 28 utilizes the common base 26 in between a pair of opposed standoff legs 30. A pair of co-planar mounting flanges 32 extend outwardly from the legs 30 and form together with the inverted first U-section 28 what is commonly referred to as a hat section. Within the inverted U-section 28 is a cooling air passageway 34. The second U-shaped section is an upright U-shaped section best shown in FIG. 3 and generally indicated by the numeral 36. The upright U-shaped 36 shares the common base 26 and has its legs formed by the wiring end 16 and the opposed control end 22. Atop each of the ends 16, 22 is an inwardly turned top flange 38 to which the cover 14 is removably fastened by several fasteners 40. The cover 14 has a pair of side flanges 42 which extend down over the legs 30 and which abut against the mounting flanges 32 and which are removably fastened to the legs 30 by removable fasteners 44. The cover 14 is preferably of hardened aluminum and is held in direct thermally conductive contact against the flanges 38 and legs 30 so that the thermally conductive cover 14 will take heat from the frame 12 by conduction. Within an enclosure defined by the frame 12 and the cover 14, and specifically within the second U-shape 36 and the cover 14, is the interior component compartment 46 which contains the electronic componentry of the inverter 10. The electronic componentry includes a primary power supply transformer 48.

Within the compartment 46 is most of the power supply transformer 48, an internal primary heat sink 50, a printed circuit board 52 (hereinafter referred to as the PCB 52) and a plurality of power switches 54 which are metal oxide semi-conductor field effect transistors (MOSFET's). The transformer 48 is mounted with the transformer metal laminations 56 parallel to and fastened directly against the interior surface of the frame base 26 by transformer mounting fasteners 58. Heat from the transformer laminations 56 is conductively passed directly into the frame 12 which is the primary heat sink and heat diffuser for the transformer 48. The frame base 26 has a transformer cooling air aperture 60, sized smaller than the transformer coil 62 and smaller than the laminations 56, through which one-half of the transformer coil 62 extends down into the cooling air passageway 34. The external portion of the coil 62 may be covered by a thermally conductive metal coil cover 64 which is also fastened in direct conductive heat exchange relationship to the frame 12. The bottom of the coil cover 64 is spaced up from the mounting flanges 32 so that cooling air can flow under the coil cover 64. If the cover 64 doesn't need to be and isn't used, cooling air flows directly over the transformer coil 62. The transformer 48 is immediately adjacent the wiring end 16 and is spaced from the control end 22. The transformer 48 is the heaviest component in the internal component compartment 46, and is mounted as low as possible to reduce its absolute moment and bending moment under shock and vibration, and is also mounted so that most shock and vibration loads are picked up in shear, compression and/or tension loading.

An internal primary heat sink 50 is mounted directly to and against the frame control end 22 as is the external secondary heat sink 24. The heat sinks 50, 24 are on opposite sides of the frame 12 from each other and are pulled together in overlapping compression upon the control end 22 of the frame 12 by heat sink screws 66. The internal heat sink 50 is an elongate length of aluminum bar stock having an outer face fastened against the frame control end 22 and an internal face to which the power switches 54 are directly fastened. Excess and waste heat from the power switches 54 is conductively and directly transferred from the bodies of the switches 54 into the internal heat sink 50 wherein the heat is spread out, and then into and through the frame control end 22 and then into the secondary external heat sink 24.

It is important that all of the MOSFET power switches 54 be kept at the same operating temperature for maximum efficiency, maximum output voltage, and for the highest reliability and in this improved construction, all of the power switches 54 are mounted in a symmetrical orderly manner upon a single contiguous internal primary heat sink 50 with fairly even conductive and convective cooling and the switches 54 are kept at generally similar temperatures so that each and every one of the plurality of switches 54 operating handles and switches an equal amount of current and so that each switch 54 does its fair and equal share of electrical switching and is not over-loaded.

Figure 2:
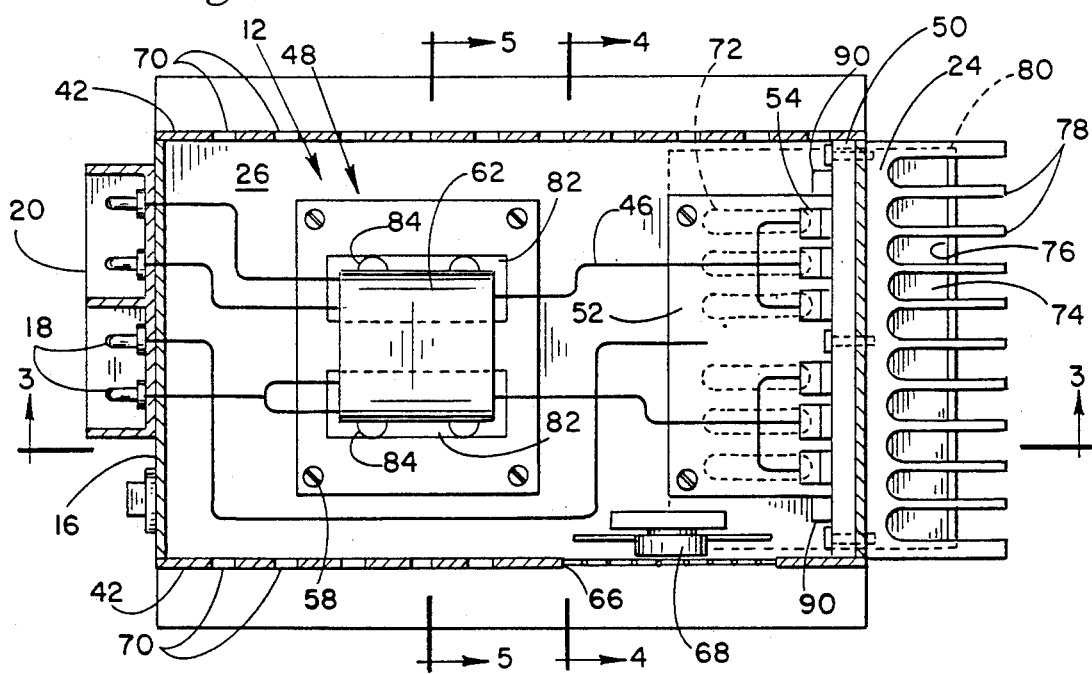
FIG. 2 is a top plan view in section through lines II—II.

An important feature of this invention is that the inverter 10 has new and improved forced ventilation cooling of the electronic componentry and of the external heat sink 24. One of the enclosure panels, and in this case a cover side flange 42, has a cooling air inlet aperture 66 to which is mounted an electrically powered fan 68 in operative registry. The fan 68 preferably is inside of the cover 14, and is a conventional pancake type combination motor and fan. The internal fan 68 causes extreme air turbulence in the component compartment 46 and air outlet slots 70 provide for controlled flow of air through the compartment 46 as well as controlled static pressure within the compartment 46. An important feature of the ventilation system is that at least one and preferably a plurality of cooling air outlets 72 are provided adjacent the control end 22 of the frame 12, specifically the outlets 72 are preferably in the common base 26 underneath the PCB 52. Underneath the cooling air apertures 72 is an air detector panel 74 that directs a fan forced air flow towards the external heat sink 24. At the outer end of the director panel 74 is an upwardly turned director flange 76 that turns and directs the forced air flow up and over the heat sink 24 and in particular through the fins 78 of the heat sink 24. The panel 74 and flange 76 are preferably the full width of the frame 12 as best seen in FIGS. 2 & 4, and the panel 74 and flange 76 are preferably part of a cooling air duct 80 that is fastened to the frame 12 and positioned in the control end 22 of the frame cooling air passageway 34. The flange 76 is positioned about midway under the fins 78 for directing a forced cooling air flow from the compartment 46 up and over the fins 78 in a pattern somewhat as shown in FIG. 3. The fan 68 is preferably off to one side of the PCB 52 and faces the PCB 52 and the switches 54, and keeps a turbulent air flow moving over the switches 54, the primary heat sink 50 and over and under the PCB 52 to keep these components cooled by a direct air flow thereover.

A further important feature of this invention is best shown in FIGS. 2, 3 & 5 wherein a proprietary transformer 48 is constructed with a transformer cooling air passageway 82 inside of and through the metal lamination core 56 and around and past the generally round wire coil 62. This passageway 82 extends through the coil aperture 60 and out of the compartment 46, the passageway 82 then extends to ambient through outlet apertures 84 in the coil cover 64 and into the frame cooling air passageway 34. Air that has been drawn in the air inlet 66 is continuously forced through the transformer 48 via the pathway 82 to continuously directly cool the coil 62 and the metal core 56 to force the operating temperature of the transformer 48 down. All air for turbulent cooling, exterior cooling of the heat sink 24, and cooling of the transformer 48 is taken in through a single air inlet 66 that may easily be equipped with an appropriate single filter element (not shown) for use in adverse or questionable ambients.

Figure 6:
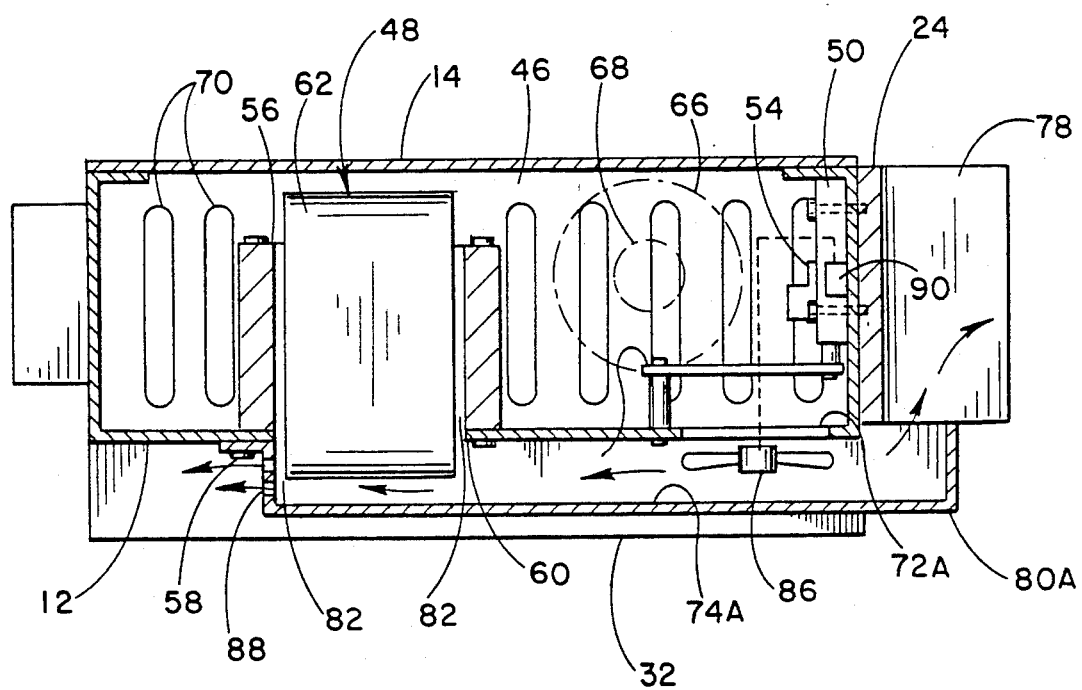
FIG. 6 is a side elevational view in section similar to FIG. 3, but showing an alternative preferred embodiment of improved inverter.

FIG. 6 has a second fan 86 mounted in registry with a single large cooling air outlet 72A to draw air out of the compartment 46. The second fan 86 is preferably mounted in an alternative duct 80A having an extended director panel 74A that extends below and past the transformer coil aperture 60. The alternative duct 80A has a transformer director flange 88 that is secured and sealed to the frame 12. In this structure a plurality of air slots 70 are positioned on each side of the transformer 48. In the structure of FIG. 6, both fans 68, 86 operate concurrently. All air is still drawn in through a single air inlet aperture 66. Again there is an extremely turbulent air flow in the compartment 46 due to the single fan 68. The second fan 86 forcibly recirculates air through the transformer 48 from the duct 80A through the base 12, past the coil 62 and into the enclosure. The second fan 86 also forces more air, in a turbulent flow, over the heat exchanger 24 and through the fins 78.

The fans 68, 86 are under the control of thermostatic on-off and safety switches 90 mounted directly upon the internal heat sink 50.

The advantages of this new and improved cooling method and apparatus are many. The temperature of the inverter 10 does not surge up and down, all electrical components can be worked harder, and a significantly higher sustainable output power is achieved for electrical devices such as microwave ovens. The fans 68, 86 are all internal and the entire ventilation system is self contained. The additional cost is relatively modest for the fans 68, 86 and associated additional structure.

Many other advantages, features and additional objects of the present invention will become manifest to those versed in the art upon making reference to the detailed description and accompanying drawings in which the preferred embodiment incorporating the principles of the present invention is set forth and shown by way of illustrative example.

Although other advantages may be found and realized and various modifications may be suggested by those versed in the art, be understood that we embody within the scope of the patent warranted hereon, all such embodiments as reasonably and properly come within the scope of our contribution to the art.

LEXICON

10 Inverter
80 Cooling air duct (80A)
2 Frame
2 Transformer Cooling Passageway
4 Cover
4 Air Outlets in 64
6 Wiring End
6 Second Fan
8 DC Terminals
8 Transformer Flange
20 Wiring Compartments
90 Tslot Switches
2 Control End
2
4
4
6 Common Base
6
8
8
30 Legs
100
2 MTG Flanges
2
4 Cooling Air Passageway
4
6 2nd Upright U-section
6
8 Top Flanges
8
40 Cover Fastener
110
2 Cover Side Flanges
2
4 Cover Side Fasteners
4
6 Interior Component Compartment
6
8 Transformer
8
50 Interior Heat Sink
120
2 PCB
4 Power Switches (Mosfets)
6 Metal Laminations
8 Fasteners
60 Aperture For 48
2 Coil of 48
4 Coil Cover
6 Cool Air Inlet Aperture
8 Fan and Motor Unit
20 Air Outlet Slots
2 Cooling Air Outlets (72A)
4 Director Power (74A)
6 Director Flange
8 Fins

We claim as our invention:

1. A DC to AC inverter having improved structure for cooling itself and increasing power output, comprising:
   (a) an enclosure with a cooling air inlet aperture;
   (b) means within the enclosure for inverting DC electricity to AC electricity, said inverting means including power current switches;
   (c) a finned heat sink in thermally conductive relationship with said switches;
   (d) a cooling air fan connected to the cooling air inlet aperture wherein the cooling air fan moves cooling air through the cooling air inlet aperture;
   (e) at least one cooling air outlet through said enclosure;
   (f) air guiding means enclosing said cooling air outlet, said air guiding means extending from said air outlet to said heat sink and having means for directing a fan forced air through said finned heat sink;
   (g) a power transformer within said enclosure and electronically connected to said switches;
   (h) a cooling air passageway through the interior of a transformer metal core; and
   (i) a transformer cooling air port to allow air to flow through said transformer cooling air passageway.

2. The inverter of claim 1, in which said air guiding means guides air to both said air outlet and said air port.

3. A DC to AC inverter having improved structure for cooling itself and increasing power output, comprising:
   (a) an enclosure with a cooling air inlet aperture;
   (b) means within the enclosure for inverting DC electricity to AC electricity, said inverting means including power current switches;
   (c) a finned heat sink in thermally conductive relationship with said switches;
   (d) a cooling air fan connected to the cooling air inlet aperture wherein the cooling air fan moves cooling air through the cooling air inlet aperture;
   (e) at least one cooling air outlet through said enclosure;
   (f) air guiding means enclosing said cooling air outlet, said air guiding means extending from said air outlet to said heat sink and having means for directing a fan forced air through said finned heat sink; and (g) a second fan positioned to draw air from said enclosure and to expel air from said guiding means, said first and second fans being operatively connected in parallel, said fans being provided their air through said cooling air inlet aperture.

4. The inverter of claim 3, in which said fan is in said guiding means.

5. The invention of claim 3 further comprising a power transformer within and mounted to said enclosure wherein the power transformer has a transformer metal core and within the metal core there is a cooling air passageway into which the cooling air may pass to cool the power transformer.

6. The inverter of claim 5 further comprising at least one air outlet slot through said enclosure wherein the at least one air outlet slot is adjacent to said transformer and disposed to allow cooling air to exit the enclosure.

7. A DC to AC inverter having improved structure for cooling itself and increasing power output, comprising:

(a) an enclosure with a cooling air inlet aperture;
(b) means within the enclosure for inverting DC electricity to AC electricity, said inverting means including power current switches;
(c) a finned heat sink in thermally conductive relationship with said switches;
(d) a cooling air fan connected to the cooling air inlet aperture wherein the cooling air fan moves cooling air through the cooling air inlet aperture;
(e) at least one cooling air outlet through said enclosure;
(f) air guiding means enclosing said cooling air outlet, said air guiding means extending from said air outlet to said heat sink and having means for directing a fan forced air flow through said finned heat sink; and
(g) a U-section base attached to the inverter wherein said air guiding means is mounted within said U-section base.

8. A DC to AC inverter having improved structure for cooling itself and increasing power output, comprising:

(a) an enclosure with a cooling air inlet aperture and a floor;
(b) means within the enclosure for inverting DC electricity to AC electricity, said inverting means including power current switches;
(c) a finned heat sink in thermally conductive relationship with said switches;
(d) a cooling air fan connected to the cooling air inlet aperture wherein the cooling air fan moves cooling air through the cooling air inlet aperture;
(e) at least one cooling air outlet through said enclosure; and
(f) air guiding means enclosing said cooling air outlet, said air guiding means extending from said air outlet to said heat sink and having means for directing a fan forced air flow through said finned heat sink, and wherein said guiding means is at a level below the level of the floor of said enclosure, so that any water into the guiding means will not drain into the enclosure.

9. A DC to AC inverter having improved structure for cooling and increasing power output, comprising:

(a) an enclosure with a cooling air inlet aperture;
(b) means within the enclosure for inverting DC electricity to AC electricity, said inverting means including a power transformer having a metal core and windings about a portion of the core;
(c) a cooling air fan connected to the cooling air inlet aperture wherein the cooling air fan moves cooling air through the cooling air inlet aperture;
(d) means effectively sealing one end of said core to said enclosure, the other end of said core being open within the enclosure; and
(e) a transformer cooling air passageway between said core and said windings, said passageway extending through said enclosure, so that said fan forces at least part of its air flow through the inside of said transformer core and directly past the windings.

10. The inverter of claim 9, in which said passageway extends to at least one transformer cooling air outlet on the outside of said enclosure.

11. The inverter of claim 10, in which said outlet is in a cooling air passageway between legs of an inverted U-section base of said inverter.

12. The inverter of claim 9, in which said fan is operative in a duct on the outside of said enclosure, said duct being in communication with said transformer passageway, and including a second fan in said enclosure for moving a turbulent air flow about the outside of the transformer.

13. The inverter of claim 12, including means in said duct for directing a cooling air flow over a heat sink in conductive thermal exchange with inverter power switches, said switches being within the enclosure and said heat sink being outside of the enclosure.

14. In the inverting of DC electricity to AC electricity, a method of cooling a DC to AC inverter comprising the steps of:

a) drawing a flow of ambient air into an enclosure of the inverter;
b) turbulently moving the air within the enclosure and over internal electrical componentry of the inverter;
c) exhausting at least a portion of the moving air from the inside to the outside of the enclosure; and
d) directing the exhausted air over an external heat sink in direct thermal exchange relationship with at least part of the internal electrical componentry and wherein the air is exhausted downwardly and directed upwardly.

15. In the inverting of DC electricity to AC electricity, a method of cooling a DC to AC inverter comprising the steps of:

a) drawing a flow of ambient air into an enclosure of the inverter;
b) turbulently moving the air within the enclosure and over internal electrical componentry of the inverter;
c) exhausting at least a portion of the moving air from the inside to the outside of the enclosure;
d) directing the exhausted air over an external heat sink in direct thermal exchange relationship with at least part of the internal electrical componentry; and
e) directing a portion of the moving air through the inside of a power transformer and through a transformer cooling air aperture through the enclosure.

16. In the inverting of DC electricity to AC electricity, a method of cooling a DC to AC inverter comprising the steps of:

a) drawing a flow of ambient air into an enclosure of the inverter;

b) turbulently moving the air within the enclosure and over internal electrical componentry of the inverter;
c) exhausting at least a portion of the moving air from the inside to the outside of the enclosure;
d) directing the exhausted air over an external heat sink in direct thermal exchange relationship with at least part of the internal electrical componentry, and wherein said portion of moving air is at first drawn from said enclosure and then forced through said aperture and through said transformer and back into said enclosure.

17. In the inverting of DC electricity to AC electricity, a method of cooling a DC to AC inverter comprising the steps of:
a) drawing a flow of ambient air into an enclosure of the inverter;
b) turbulently moving the air within the enclosure and over internal electrical componentry of the inverter; and
c) directing at least a portion of the air through a primary power supply transformer wherein the primary power supply transformer includes a transformer core and a winding coil and wherein the portion of air is directed in between the transformer core and wire winding.

18. The method of claim 17 wherein the step of directing at least a portion of the air directs the air out of the enclosure.

19. The method of claim 18, including the further steps of withdrawing the air portion from the enclosure, and pushing the withdrawn air portion through the transformer and back into the enclosure.

e) directing a portion of the moving air through the inside of a power transformer and through a transformer cooling air aperture through the enclosure.

20. The method of claim 17 wherein the DC to AC inverter further comprises power current switches having external heat sinks and wherein the step of directing at least a portion of the air directs the air out of the enclosure and over said heat sinks.

* * * * *